US010032806B2

(12) United States Patent
Seo et al.

(10) Patent No.: US 10,032,806 B2
(45) Date of Patent: Jul. 24, 2018

(54) DISPLAY DEVICE INCLUDING A PERIPHERAL AREA AND WIRING DISPOSED IN THE PERIPHERAL AREA

(71) Applicant: SAMSUNG DISPLAY CO., LTD., Yongin-si, Gyeonggi-Do (KR)

(72) Inventors: Tae An Seo, Hwaseong-si (KR); Jin Hwan Choi, Seoul (KR); Tae Woong Kim, Seongnam-si (KR); Bo Ik Park, Uiwang-si (KR); Ju Chan Park, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/423,658

(22) Filed: Feb. 3, 2017

(65) Prior Publication Data

US 2017/0229489 A1 Aug. 10, 2017

(30) Foreign Application Priority Data

Feb. 4, 2016 (KR) .......................... 10-2016-0014394

(51) Int. Cl.
*H01L 27/12* (2006.01)
*G02F 1/1333* (2006.01)
*G02F 1/1362* (2006.01)
*H01L 27/32* (2006.01)
*H01L 51/00* (2006.01)

(52) U.S. Cl.
CPC ...... H01L 27/1244 (2013.01); H01L 27/1218 (2013.01); H01L 27/1248 (2013.01); *G02F 1/133305* (2013.01); *G02F 1/136286* (2013.01); *H01L 27/3276* (2013.01); *H01L 51/0097* (2013.01)

(58) Field of Classification Search
CPC ............. H01L 27/1244; H01L 27/1218; H01L 27/1248; H01L 27/3276; H01L 27/12; G02F 1/136268; G02F 1/133305
USPC ................................................... 257/773, 774
See application file for complete search history.

(56) References Cited

U.S. PATENT DOCUMENTS

| 2015/0187279 A1* | 7/2015 | Lee ...................... G09G 3/3225 257/40 |
| 2016/0093644 A1* | 3/2016 | Ki ....................... H01L 29/78672 257/40 |
| 2016/0093685 A1* | 3/2016 | Kwon .................. H01L 27/3276 257/40 |
| 2017/0062760 A1* | 3/2017 | Kim .................... H01L 51/5253 |

FOREIGN PATENT DOCUMENTS

| KR | 10-2005-0067254 | 7/2005 |
| KR | 10-2006-0000853 | 1/2006 |
| KR | 10-2014-0099164 | 8/2014 |
| KR | 10-2015-0071840 | 6/2015 |

* cited by examiner

*Primary Examiner* — Alexander Oscar Williams
(74) *Attorney, Agent, or Firm* — F. Chau & Associates, LLC

(57) ABSTRACT

A display device includes a substrate including a first planarization region and a second planarization region inclined at a predetermined angle with respect to the first planarization region. A display device further includes a first wiring disposed in the second planarization region. A display device additionally includes a flexible film bonded with the substrate in the first planarization region and the second planarization region and connected to the first wiring in the second planarization region.

19 Claims, 8 Drawing Sheets

DISPLAY DEVICE INCLUDING A PERIPHERAL AREA AND WIRING DISPOSED IN THE PERIPHERAL AREA

CROSS-REFERENCE TO RELATED APPLICATION

This application claims priority under 35 U.S.C. § 119 to Korean Patent Application No. 10-2016-0014394 filed on Feb. 4, 2016 in the Korean Intellectual Property Office, the disclosure of which is incorporated by reference herein in its entirety.

TECHNICAL FIELD

The present invention relates to a display device.

DISCUSSION OF THE RELATED ART

Types of display devices include, for example, a liquid crystal display (LCD), a plasma display panel (PDP), an organic light emitting diode (OLED) display, a field effect display (FED), an electrophoretic display device, and the like.

Particularly, the OLED display includes two electrodes and an organic emission layer positioned therebetween. Where, an electron injected from one electrode and a hole injected from the other electrode are coupled with each other in the organic emission layer to generate an exciton, the exciton emits energy to emit light.

Since the OLED display has a self-luminance characteristic and does not require a separate light source, thickness and weight thereof may be reduced.

To drive the organic light emitting element of the OLED display, driving power and common power are supplied. In this case, a common power line connected to the common power is disposed in a peripheral area of the substrate. To reduce the size of a bezel, the peripheral area may be bent.

However, if the peripheral area is bent, a part of the common power line is bent and can be cracked.

SUMMARY

According to an exemplary embodiment of the present invention, a display device includes a substrate including a first planarization region and a second planarization region inclined at a predetermined angle with respect to the first planarization region. A display device further includes a first wiring disposed in the second planarization region. A display device additionally includes a flexible film bonded with the substrate in the first planarization region and the second planarization region and connected to the first wiring in the second planarization region.

According to an exemplary embodiment of the present invention, a display device includes a substrate including a first region, a second region and a third region positioned between the first region and the second region. The third region is curved. The display device further includes a display unit disposed in the first region. The display device additionally includes a first wiring disposed in the second region and connected to the display unit through a flexible film bonded on the substrate.

According to an exemplary embodiment of the present invention, a display device includes a substrate including a first planarization region, a second planarization region and a bending region positioned between the first planarization region and the second planarization region. The bending region is curved. The display device further includes a first wiring disposed in the second planarization region of the substrate. The display device additionally includes a flexible film disposed on the substrate and connected to the first wiring. A cutout in the flexible film and exposes the bending region.

DETAILED DESCRIPTION OF THE EMBODIMENTS

Figure 1:
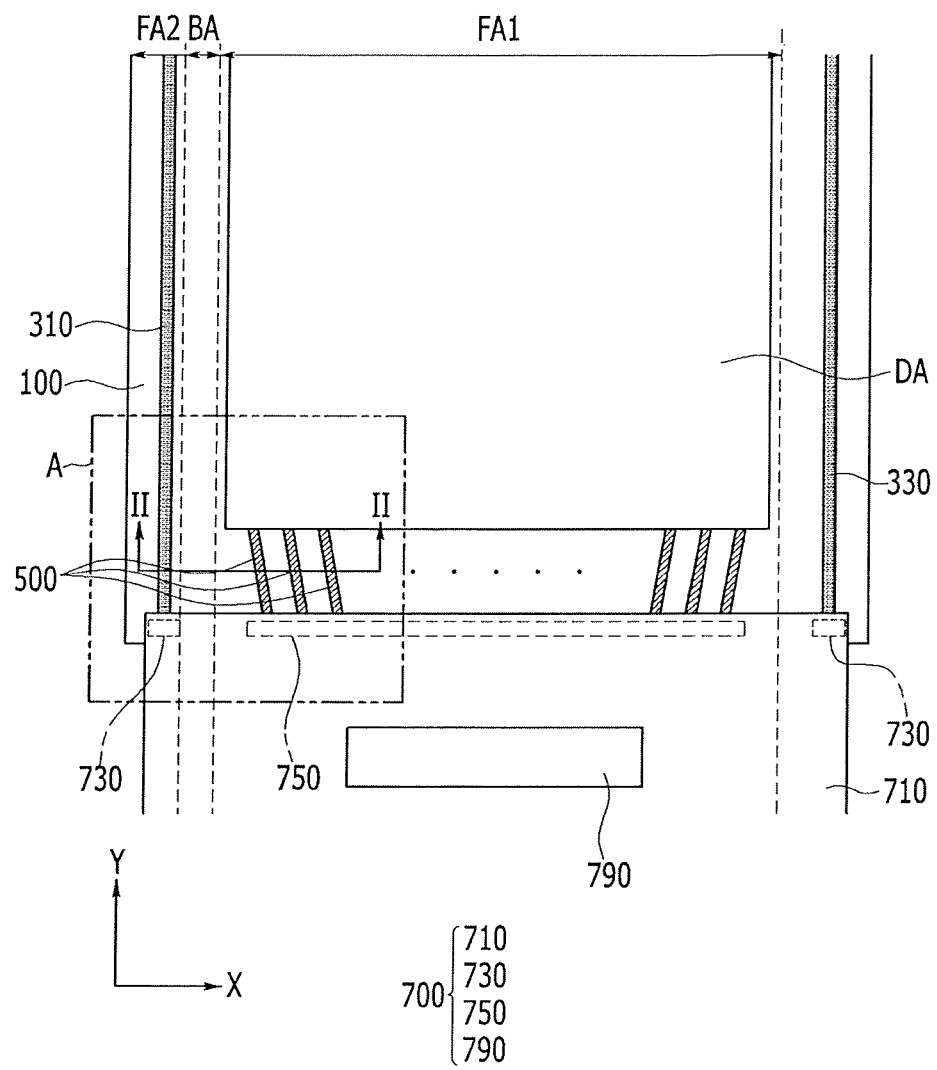
FIG. 1 is a top plan view of a part of a display device according to an exemplary embodiment of the present invention.

Exemplary embodiments of the present invention will be described more fully hereinafter with reference to the accompanying drawings. It is to be understood, however, that the described embodiments may be modified in various different ways, all without departing from the spirit and scope of the present invention.

Like reference numerals may designate like elements throughout the specification.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Next, a display device according to an exemplary embodiment of the present invention will be described with reference to FIG. 1 to FIG. 3.

Figure 2:
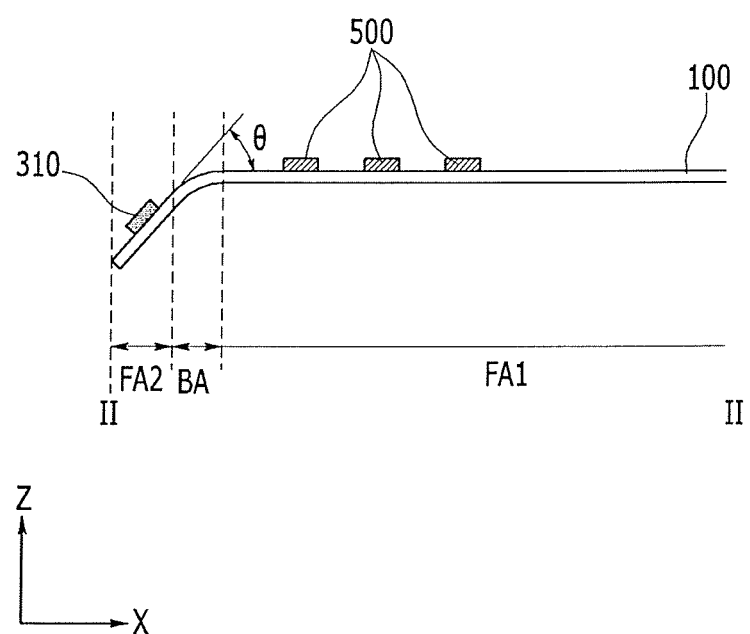
FIG. 2 is a cross-sectional view taken along a line II-II of FIG. 1.
Figure 3:
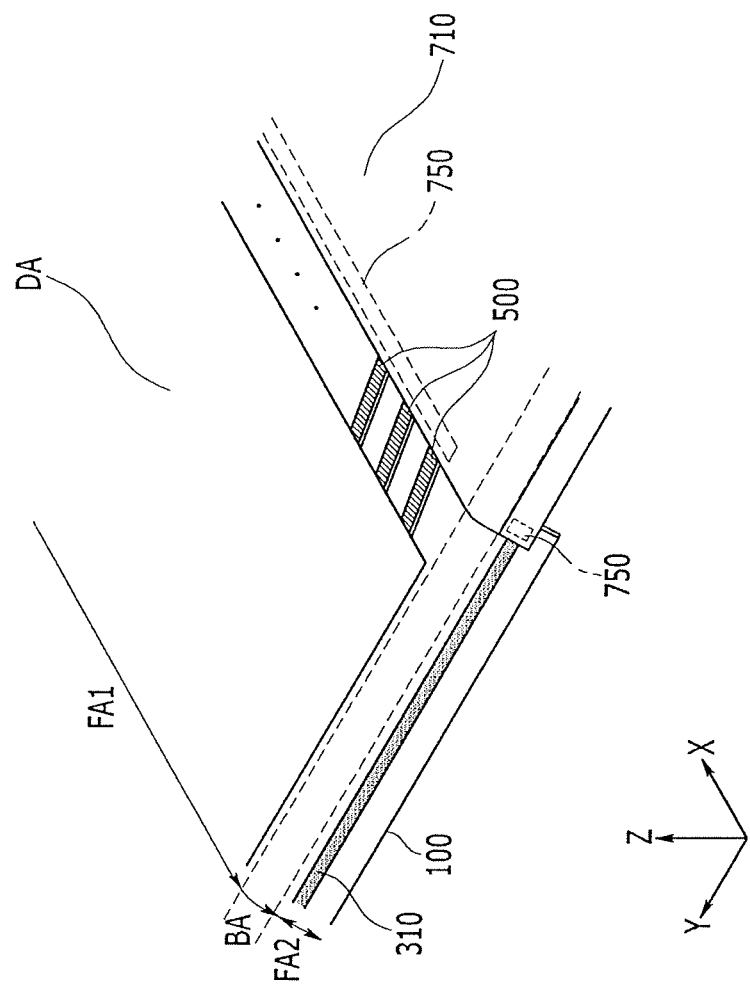
FIG. 3 is a partial perspective view of a region A of FIG. 1.

FIG. 1 is a top plan view of a part of a display device according to an exemplary embodiment of the present invention, FIG. 2 is a cross-sectional view taken along a line II-II of FIG. 1, and FIG. 3 is a partial perspective view of a region A of FIG. 1.

Referring to FIG. 1 to FIG. 3, the display device according to an exemplary embodiment of the present invention includes a substrate 100, first wirings 310 and 330, a second wiring 500, and a flexible film 700.

The substrate 100 on which several configurations for forming a display device are disposed may include a first planarization region FA1, a bending region BA, and a second planarization region FA2.

Referring to FIG. 2 and FIG. 3, the first planarization region FA1 of the substrate 100 corresponds to a flat center region of the substrate 100. A display unit DA that displays an image may be disposed in the first planarization region FA1. The display unit DA may be an organic light emitting diode (OLED) display. In an exemplary embodiment of the present invention, the display panel of the OLED display may be formed in the display unit DA. However, it is not limited thereto. For example, the display panel of a liquid crystal display (LCD), a plasma display panel (PDP), an electric field effect display (FED) panel, or an electrophoretic display panel may be disposed in the display unit DA. A configuration of the display unit DA of an exemplary embodiment of the present invention will be described later.

In addition, the bending region BA, which is a region that is bent to have a predetermined curvature, which is different from that of the first planarization region FA1, is in contact with the first planarization region FA1. For example, the bending region BA is bent at a predetermined angle with respect to the first planarization region FA1. Further, the first planarization region FA1 may be a flat surface. To minimize the width of the bezel of the display device, the bending region BA may be bent close to the first planarization region FA1.

In addition, to display an image at a side of the display device, the display unit DA may be disposed in the bending region BA, and the bending region BA may be bent along with the display unit DA. For example, the display unit DA may be disposed in the first planarization region FA1 and at least partially in the bending region BA.

Meanwhile, FIG. 1 shows that the bending region BA is disposed at a left side of the first planarization region FA1. However, it is not limited thereto. For example, the bending region BA may be disposed at a right side or both sides of the first planarization region FA1.

In this case, the display unit DA disposed in the bending region BA is disposed in the first planarization region FA1 and extended into the bending region BA. In addition, the display unit DA disposed in the bending region BA may be a separate display unit that is divided from the display unit DA disposed in the first planarization region FA1.

In addition, 'the predetermined curvature' may represent one fixed curvature, and as shown in FIG. 2, the curvature may gradually decrease from the first planarization region FA1 toward a side of the second planarization region FA2 on the substrate 100. In addition, the curvature may gradually increase from the first planarization region FA1 toward the second planarization region FA2.

The second planarization region FA2, which is a flat region positioned at the edge of the substrate 100 may be in contact with the bending region BA. In other words, as shown in FIG. 1, the first planarization region FA1, the bending region BA, and the second planarization region FA2 may be arranged along a first direction. Here, the first direction represents an X-axis in FIGS. 1-3, and a second direction represents a Y-axis in FIGS. 1 and 2.

FIG. 1 shows that the second planarization region FA2 may be disposed at the left side of the first planarization region FA1. However, exemplary embodiments of the present invention are not limited thereto. For example, the second planarization region FA2 may be disposed at the right side of the first planarization region FA1 or both sides of the first planarization region FA1. The second planarization region FA2 is a flat region like the first planarization region FA1. In an exemplary embodiment of the present invention, the first planarization region FA1 and the second planarization region FA2 may be regions in which a tensile force or a compressive force might not be applied to the substrate 100. In contrast, since the bending region BA is bent to have the predetermined curvature, a tensile force or a compressive force may be applied to the substrate 100 in the bending region BA. In this case, the first wirings 310 and 330 of the display device may be disposed in the second planarization region FA2. The first wirings 310 and 330 will be described later.

Referring to FIG. 2 and FIG. 3, the second planarization region FA2 may be inclined at a predetermined angle θ with respect to the first planarization region FA1. By virtue of the bending region BA that is bent with the predetermined curvature, the first planarization region FA1 and the second planarization region FA2, which are positioned at both sides of the bending region BA, may form a predetermined angle. In this case, the predetermined angle θ have a range of about 0 degrees to about 90 degrees.

Next, the display unit DA disposed in the first planarization region FA1 will be described with reference to FIG. 4 and FIG. 5.

According to an exemplary embodiment of the present invention, the display unit DA includes first gate wires GW1, second gate wires GW2, data wires DW, and a pixel 150.

A gate driver 210, in correspondence with a control signal supplied from an external control circuit, for example, a timing controller, sequentially supplies a scan signal to first scan lines SC2-SC2n or second scan lines SC1-SC2n-1 included in the first gate wires GW1 or the second gate wires GW2. Thus, the pixel 150 is selected by the scan signal to be sequentially supplied with a data signal. Here, the gate driver 210 shown in FIG. 4 is formed in a driving chip 790 on the flexible film 700 that will be described later, and for convenience of explanation, only the gate driver 210 is shown in FIG. 4.

The first gate wires GW1 are positioned on the substrate 100 with the first insulating layer GI1 interposed therebetween, and the first gate wires GW1 extend in the first direction. The first gate wires GW1 may include a second scan line SC2n-1 and emission control lines E1-En.

The second scan line SC2n-1 is connected to the gate driver 210 and is supplied with the scan signal from the gate driver 210. The emission control line En is connected to an emission control driver 220, and the emission control line En is supplied with the emission control signal from the emission control driver 220. Here, the emission control driver 220 shown in FIG. 4 may be formed in the driving chip 790 on the flexible film 700 that will be described later, and for convenience of explanation, only the emission control driver 220 is shown in FIG. 4.

The second gate wires GW2 are positioned on the first gate wires GW1 with the second insulating layer GI2 interposed therebetween, and the second gate wires GW2 may extend in the first direction. The second gate wires GW2 include the first scan line SC2n and an initialization power line Vinit.

The first gate wires GW1 and the second gate wires GW2 do not overlap each other.

The first scan line SC2n is connected to the gate driver 210 and is supplied with the scan signal from the gate driver 210. The initialization power line Vinit is connected to the gate driver 210 and is supplied with an initialization power from the gate driver 210.

In an exemplary embodiment of the present invention, the initialization power line Vinit receives the initialization power from the gate driver 210; however, the initialization power line Vinit may be additionally connected to another component to be supplied with the initialization power from another component.

The emission control driver 220 sequentially supplies the emission control signal to the emission control line En in response to the control signal from the outside such as from the timing controller. Thus, the emission of the pixel 150 is controlled by the emission control signal.

In other words, the emission control signal controls an emission time of the pixel 150. However, the emission control driver 220 may be omitted depending on an inner structure of the pixel 150.

A data driver 230 supplies the data signal to the data line Dam among the data wires DW in response to the control signal supplied from the outside such as from the timing controller.

The data signal supplied to the data line Dam is supplied to the pixel 150 selected by the scan signal in response to the scan signal being supplied to the first scan line SC2n or the second scan line SC2n-1. Thus, the pixel 150 is charged with the voltage corresponding to the data signal and emits a light corresponding thereto. Here, the data driver 230 shown in FIG. 4 may be formed in the driving chip 790 on the flexible film 700 that will be described later, and for convenience of explanation, only the data driver 230 is shown in FIG. 4.

The data wires DW may be positioned on the second gate wires GW2 with the third insulating layer ILD interposed therebetween, and the data wires DW extend in the second direction crossing the first direction. The data wires DW may include data lines DA1-DAm and a driving power line ELVDDL. The data line DAm is connected to the data driver 230 and is supplied with the data signal from the data driver 230. The driving power line ELVDDL is connected to an external first power source ELVDD that will be described later, and is supplied with the driving power from the first power source ELVDD.

In this case, the driving power line ELVDDL and the data line DAm may be formed with the same layer on the third insulating layer ILD. However, the present invention is not limited thereto. For example, the driving power line ELVDDL and the data line DAm may be formed with different layers. For example, the driving power line ELVDDL may be formed with the same layer as the first gate wire GW1, and the data line DAm may be formed with the same layer as the second gate wire GW2.

In contrast, the driving power line ELVDDL may be formed with the same layer as the second gate wire GW2, and the data line DAm may be formed with the same layer as the first gate wire GW1. A display unit DA includes a plurality of pixels 150 positioned in a region where the first gate wires GW1 and the second gate wires GW2 intersect with the data wires DW. Here, each pixel 150 may include an organic light emitting element for emitting light with a luminance corresponding to a driving current corresponding to the data signal, and a pixel circuit to control the driving current flowing to the organic light emitting element. The pixel circuit is respectively connected to the first gate wires GW1, the second gate wires GW2, and the data wires DW, and the organic light emitting element is connected to the pixel circuit. The pixel 150 is described as an organic light emitting element; however, the pixel 150 included in the display device of the exemplary embodiment is not limited thereto. For example, a liquid crystal display element or an electrophoretic display element may be included in the display device.

The organic light emitting element of the display unit DA is connected to the external first power source ELVDD via the pixel circuit interposed therebetween, and is connected to a second power source ELVSS. The first power source ELVDD and the second power source ELVSS respectively supply the driving power and the common power to the pixel 150 of the display unit DA. The pixel 150 emits light with the luminance corresponding to the driving current from the first power source ELVDD through the organic light emitting element in response to the data signal that depends on the driving power and the common power supplied to the pixel 150.

As described above, the display device according to an exemplary embodiment of the present invention may include the first gate wires GW1 including the second scan line SC2n-1 and the emission control line En, and the second gate wires GW2 including the first scan line SC2n and the initialization power line Vinit as the gate wires GW1 and GW2 cross the pixel 150 in the first direction and do not overlap each other.

The first gate wires GW1 and the second gate wires GW2 are not positioned at the same layer, but may be positioned at different layers via the second insulating layer GI2 interposed therebetween. Accordingly, a distance W between the gate wires GW1 and GW2 that are positioned at the different layers and are adjacent to each other may be decreased, thereby forming more pixels 150 in the same area. In other words, a high resolution display device may be formed.

Again, referring to FIG. 1, the first wirings 310 and 330 are disposed in the second planarization region FA2 of the substrate 100. In an exemplary embodiment of the present invention, the first wirings 310 and 330 may only be disposed in the second planarization region FA2 that is a flat region. The first wirings 310 and 330 are not disposed in the bending region BA adjacent to the second planarization region FA2.

As described above, a tensile force or a compressive force may be applied to the substrate 100 in the bending region BA. In this case, if the wiring is disposed on the substrate 100 at the bending region BA, an adhesive force of the wiring and the substrate 100 may be decreased. Accordingly, the wiring may be separated from the substrate 100. In addition, a crack may be generated in the wiring disposed on the substrate 100 at the bending region BA, such that the wiring may be disconnected. In other words, the wiring may form a gap such that a signal can no longer pass therebetween.

However, in an exemplary embodiment of the present invention, the first wirings 310 and 330 are only disposed in the second planarization region FA2 such that the first wirings 310 and 330 may be prevented from being lifted from the substrate 100 or being damaged.

Figure 4:
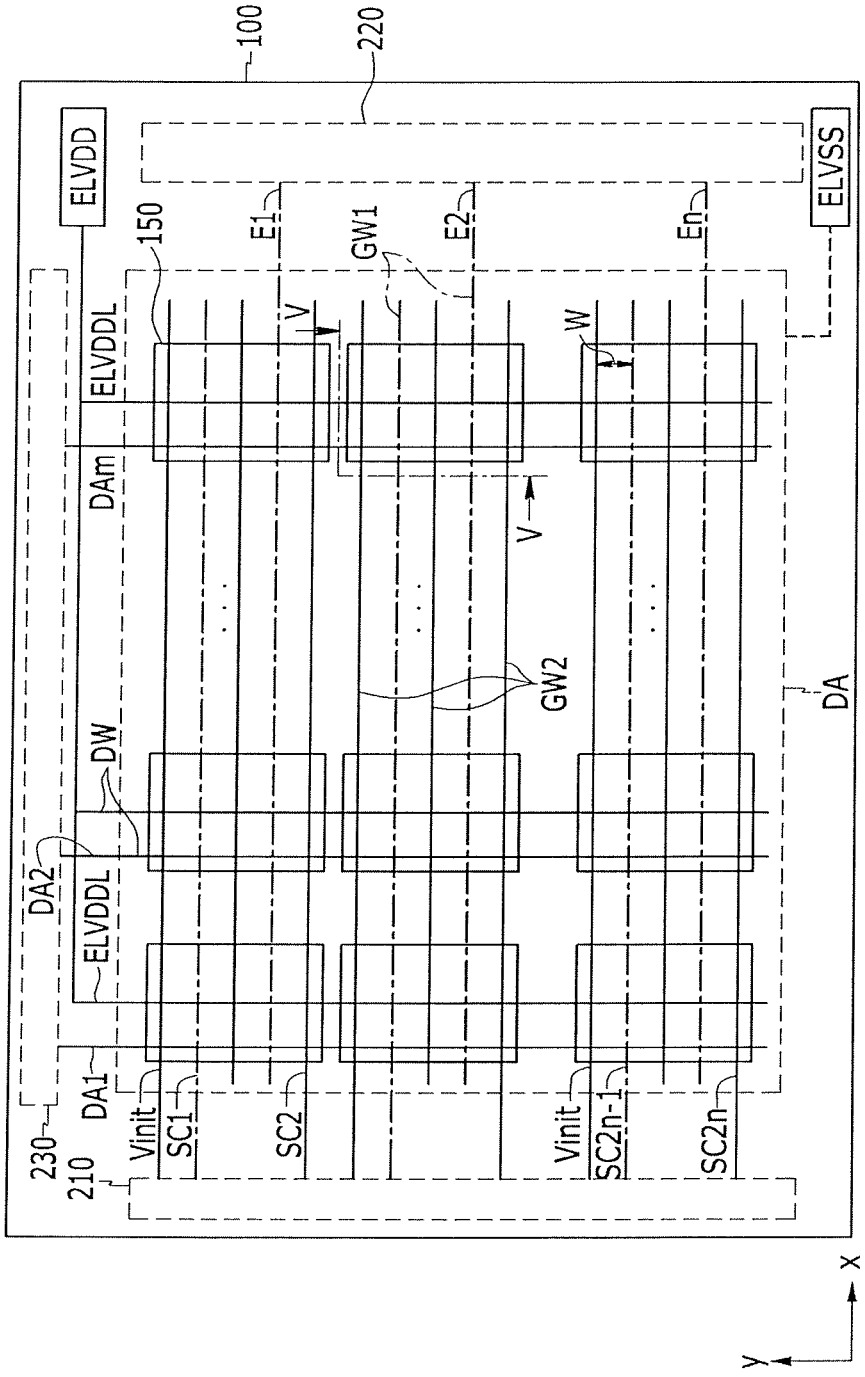
FIG. 4 is a view schematically showing a display unit of FIG. 1.
Figure 5:
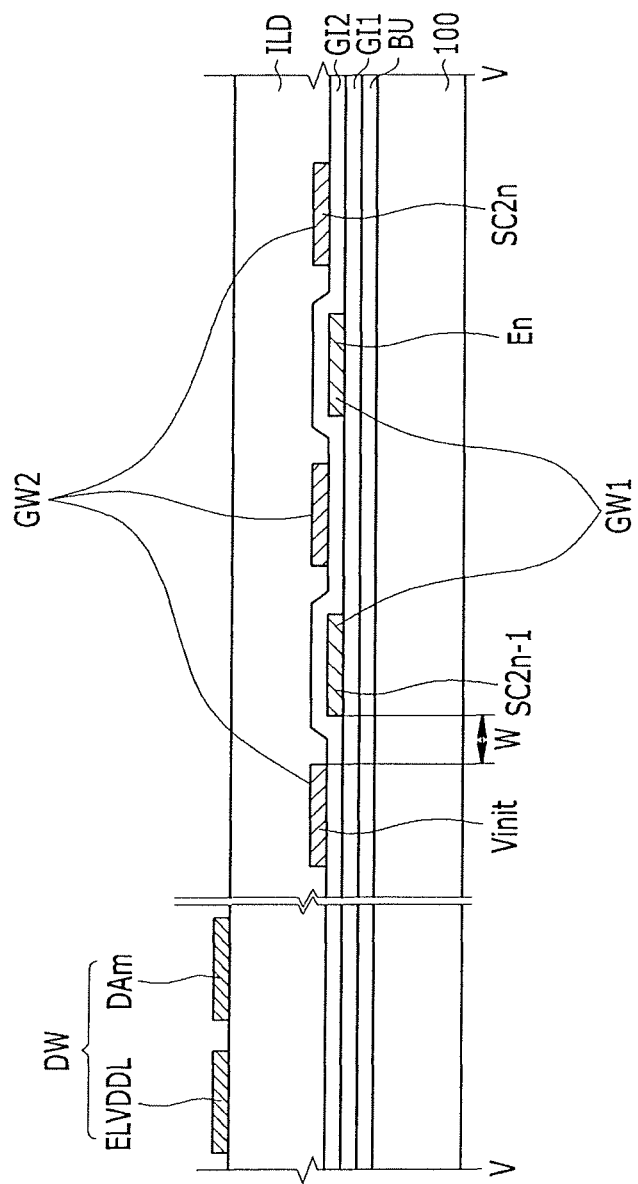
FIG. 5 is a cross-sectional view taken along a line V-V of FIG. 4.

In an exemplary embodiment of the present invention, the first wirings 310 and 330 may be the common power line connected to the above-described second power source ELVSS of FIG. 4. For example, the first wirings 310 and 330 may be connected to the display unit through the flexible film 700. In other words, the first wirings 310 and 330 may receive the power from the second power source ELVSS to supply the power to the pixel 150 of the display unit DA. In this case, the second power source ELVSS may supply the power to the first wirings 310 and 330 through a later-described flexible film 700.

In addition, the second wiring 500 may be disposed in the first planarization region FA1 of the substrate 100. The second wiring 500 may be disposed under the first planarization region FA1, thereby being bonded with the flexible film 700. For example, the flexible film 700 may be disposed below the second wiring 500. In an exemplary embodiment of the present invention, the second wiring 500 may be connected to the data wires DW disposed in the display unit DA.

Referring to FIG. 1 and FIG. 3, the flexible film 700 may be coupled to one end of the substrate 100. For example, the flexible film 700 may be coupled to the end of the substrate 100, thereby supplying the power, the scan signal, and the data signal to the display unit DA.

In this case, the flexible film 700 may have a shape in which a plurality of metal wirings is formed in a base film 710 having flexibility.

The base film 710 may have a shape corresponding to a shape of the substrate 100. In other words, the base film 710 is bent to have substantially the same shape as the substrate 100, and the base film 710 may be bonded to the end of the substrate 100. For example, the base film 710 may include a region corresponding to the first planarization region FA1, the bending region BA, and the second planarization region FA2 of the substrate 100. Accordingly, the flexible film 700 may be bonded with the substrate 100 in the first planarization region FA1, the bending region BA, and the second planarization region FA2. Further, the flexible film 700 may be in contact with the substrate 100.

A first pad part 730 may be disposed in the base film 710. The first pad part 730 may be disposed on the base film 710 at a position corresponding to the second planarization region FA2 of the substrate 100. The first pad part 730 is in contact with the first wirings 310 and 330 of the substrate 100, thereby being electrically connected to the first wirings 310 and 330. In addition, the first pad part 730 may be connected to the driving chip 790 by wiring disposed on the base film 710.

In addition, a second pad part 750 may be disposed on the base film 710. The second pad part 750 may be disposed on the base film 710 at a position corresponding to the first planarization region FA1 of the substrate 100. In this case, the second pad part 750 is in contact with the second wiring 500 of the substrate 100, thereby being electrically connected to the second wiring 500.

In this case, the flexible film 700 may be mounted with the driving chip 790 used to drive the display unit DA. In an exemplary embodiment of the present invention, the flexible film 700 may be a chip on film (COF). However, it is not limited thereto. For example, the driving chip 790 may be disposed at one side of the substrate 100 as a chip on glass (COG) type or a chip on plastic (COP) type.

The driving chip 790 may be mounted to the base film 710 to generate the driving signal. For example, the driving chip 790 may be a scan driving circuit that generates the scan signal or a data driving circuit that generates the data signal by receiving the control signal from the external control circuit. In other words, the above-described gate driver 210 or data driver 230 may be disposed within the driving chip 790.

According to an exemplary embodiment of the present invention, the flexible film 700 may be bent to have a shape corresponding to the substrate 100 so that it may be bonded directly to the second planarization region FA2 of the substrate 100. Accordingly, the first wirings 310 and 330 disposed in the second planarization region FA2 of the substrate 100 may be prevented from being disposed in the bending region BA. Hereinafter, this will be described with reference to FIG. 6.

Figure 6:
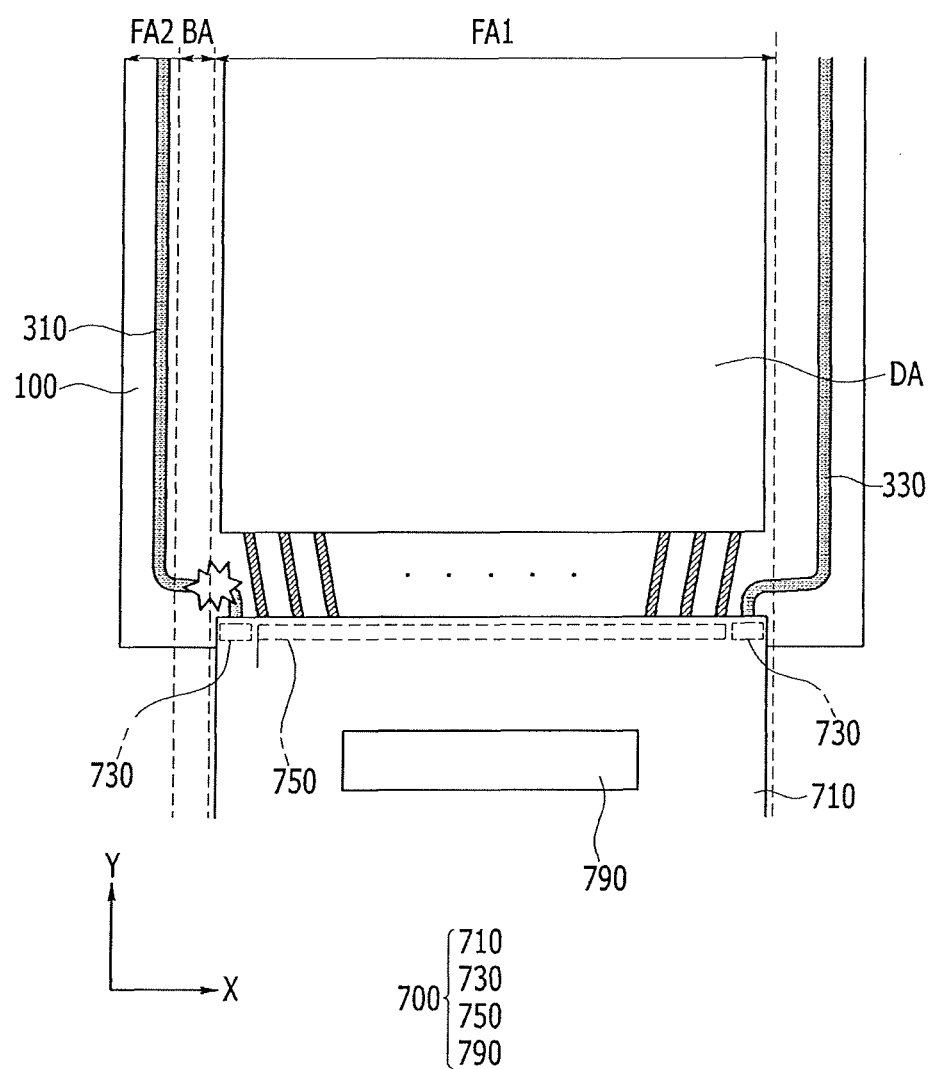
FIG. 6 is a view showing a case in which a part of a first wiring is disposed in a bending region in a display device according to a comparative example.

FIG. 6 is a view showing a case in which a part of the first wirings 310 and 330 is disposed in the bending region BA in a display device according to a comparative example, and the first wirings 310 and 330 extend into the first planarization region FA1 through the bending region BA. In addition, the flexible film 700 may only be bonded to the first planarization region FA1 of the substrate 100. The first wirings 310 and 330 extend into the first planarization region FA1 and are connected to the first pad part 730 disposed in the first planarization region FA1.

In this case, a part of the first wirings 310 and 330 is disposed in the bending region BA. As described above, if the first wirings 310 and 330 are disposed in the bending region BA, the adhesive force of the first wirings 310 and 330 and the substrate 100 may be decreased, thereby the first wirings 310 and 330 may be separated from the substrate 100. In addition, a compressive force or a tensile force may be applied to the first wirings 310 and 330 such that a crack may be generated in the first wirings 310 and 330, thereby causing a disconnection in the first wirings 310 and 330.

Accordingly, in an exemplary embodiment of the present invention, the part of the first wiring 310 and 330 that extends across the bending region BA and into the first planarization layer FA1 is prevented from being disposed in the bending region BA, thereby preventing the first wirings 310 and 330 from being lifted from the substrate 100 or being damaged.

In addition, the display device according to an exemplary embodiment of the present invention will be described with reference to FIG. 7 and FIG. 8. When describing the exemplary embodiment of the present invention, a description of the same configurations as in the above-described exemplary embodiment is omitted.

Figure 7:
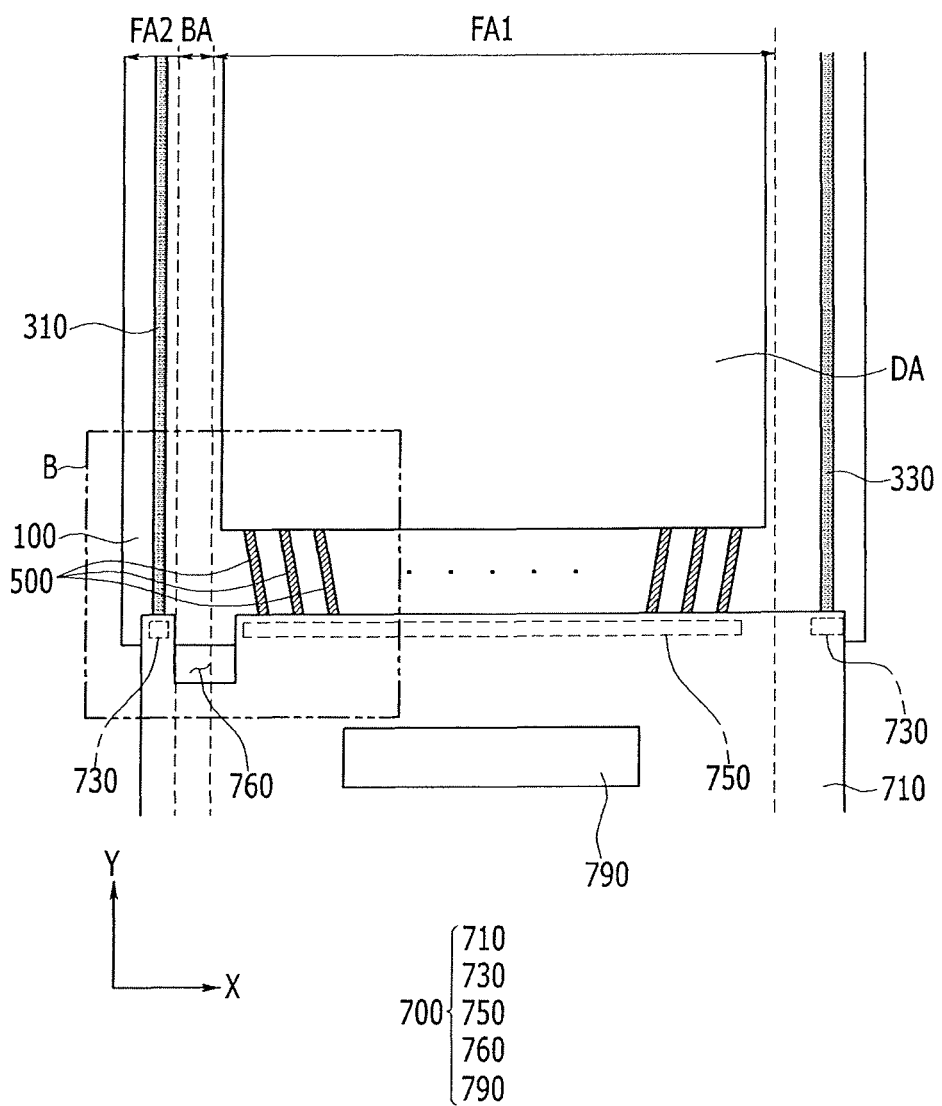
FIG. 7 is a top plan view of a part of a display device according to an exemplary embodiment of the present invention.
Figure 8:
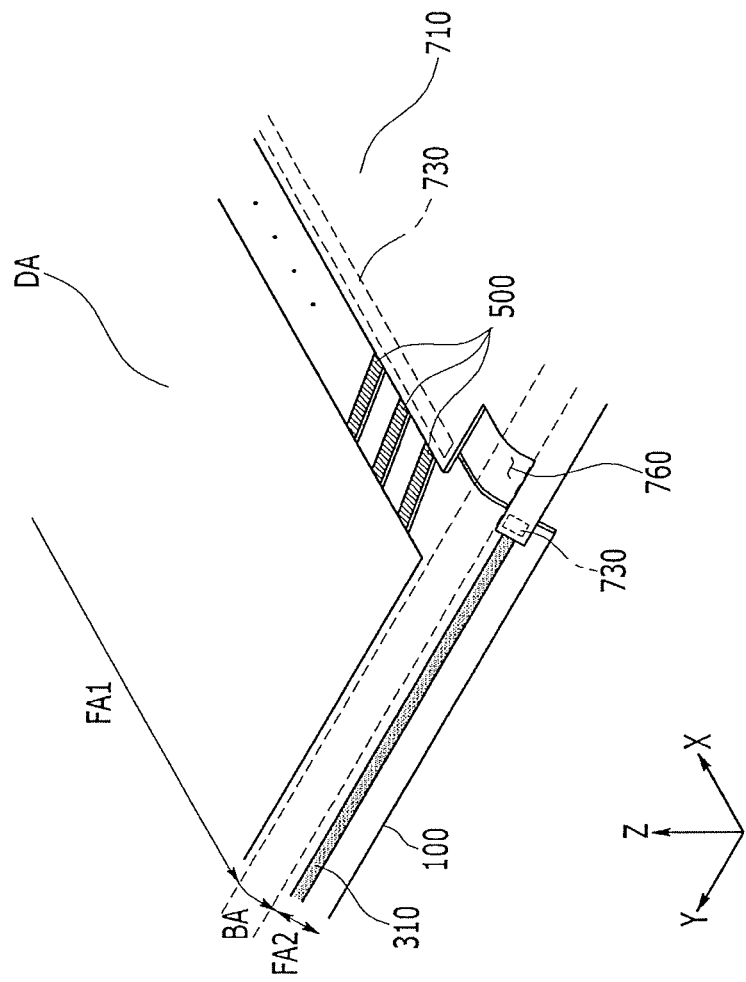
FIG. 8 is a partial perspective view of a region B of FIG. 7.

FIG. 7 is a top plan view of a part of a display device according to an exemplary embodiment of the present invention, and FIG. 8 is a partial perspective view of a region B of FIG. 7.

Referring to FIG. 7 and FIG. 8, a cutout 760 may be formed in the base film 710 of the flexible film 700. The cutout 760 may be formed at an end of the base film 710 to which the substrate 100 is bonded. For example, the cutout 760 may be formed at a top end of the base film 710, which is nearest the bending region BA. In addition, the cutout 760 may correspond to the bending region BA and may partially correspond to the first planarization layer FA1.

In an exemplary embodiment of the present invention, the cutout 760 may be formed between the first pad part 730 and the second pad part 750. In this case, the flexible film 700 might not be bonded with the substrate 100 in the bending region BA.

If the flexible film 700 and the substrate 100 are simultaneously adhered in the first planarization region FA1, the bending region BA, and the second planarization region FA2, part of the flexible film 700 may be lifted from the substrate 100 or wrinkles may be formed in the part of the flexible film 700.

However, in accordance with an exemplary embodiment of the present invention, if the cutout 760 is formed in the base film 710, the lifting phenomenon or the wrinkle generation that may occur in the flexible film 700 may be suppressed such that adhesion state of the substrate 100 and the flexible film 700 may be maintained.

In the display device according to an exemplary embodiment of the present invention, the first wirings 310 and 330 are only disposed in the second planarization region FA2 that is not the bending region BA such that the first wirings 310 and 330 may be prevented from being lifted from the substrate 100 or being damaged. The present invention provides a display device preventing wiring disposed in the peripheral area from being damaged even if the peripheral area of the substrate is bent. According to the above-described display device, in which the peripheral area of the substrate may be bent, the wiring disposed in the peripheral area may be prevented from being lifted or damaged.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A display device comprising:
a substrate including a first planarization region and a second planarization region inclined at a predetermined angle with respect to the first planarization region;
a bending region positioned between the first planarization region and the second planarization region;
a first wiring disposed in the second planarization region, wherein the first wiring extends parallel along an edge of the bending region without crossing into the bending region; and
a flexible film bonded with the substrate in the first planarization region and the second planarization region and connected to the first wiring in the second planarization region.

2. The display device of claim 1, wherein
a display unit for displaying an image is disposed in the first planarization region.

3. The display device of claim 2, wherein
the display unit extends toward the bending region.

4. The display device of claim 2, wherein
the first wiring is a common power line connected to the display unit.

5. The display device of claim 1, wherein
the bending region is bent to have a predetermined curvature.

6. The display device of claim 5, wherein
the flexible film is bonded with the substrate in the bending region.

7. The display device of claim 1, wherein
the first wiring is in contact with a first pad part in the flexible film.

8. The display device of claim 7, wherein
a driving chip connected to the first pad part is disposed in the flexible film.

9. The display device of claim 1, further comprising:
a second wiring disposed in the first planarization region.

10. The display device of claim 9, wherein
the flexible film is connected to the second wiring.

11. The display device of claim 9, wherein
the second wiring is in contact with a second pad part in the flexible film.

12. The display device of claim 1, wherein
a cutout is formed between a first pad part and a second pad part in the flexible film.

13. A display device comprising:
a substrate including a first region, a second region and a third region positioned between the first region and the second region, wherein the third region is curved;
a display unit disposed in the first region; and
a first wiring disposed in the second region and connected to the display unit through a flexible film bonded on the substrate, wherein the first wiring extends toward the flexible film without crossing into the third region.

14. The display device of claim 13, wherein
the flexible film is connected to the display unit through a second wiring.

15. The display device of claim 13, wherein the first wiring extends parallel to the third region.

16. A display device comprising:
a substrate including a first planarization region, a second planarization region and a bending region positioned between the first planarization region and the second planarization region, wherein the bending region is curved;
a first wiring disposed in the second planarization region of the substrate, wherein the first wiring extends parallel along an edge of the bending region without crossing into the bending region; and
a flexible film disposed on the substrate and electrically connected to the first wiring, wherein a partial cutout in the flexible film corresponds to the bending region and partially corresponds to the first planarization region.

17. The display device of claim 16, wherein the first wiring is connected to a first pad part of the flexible film.

18. The display device of claim 16, further comprising: a display unit disposed in the first planarization region; and
a second wiring disposed in the first planarization region and electrically connected to the display unit and the flexible film, wherein the partial cutout is positioned between the first wiring and the second wiring.

19. The display device of claim 16, wherein the partial cutout does not extend into the second planarization region.

* * * * *